United States Patent [19]

Dufilie et al.

[11] Patent Number: 5,264,751

[45] Date of Patent: Nov. 23, 1993

[54] UNILATERAL SURFACE WAVE TRANSDUCER

[75] Inventors: Pierre Dufilie, Vernon, Conn.; Jean Desbois, Roquefort les Pins, France

[73] Assignee: Thomson-CSF, Puteaux, France

[21] Appl. No.: 953,290

[22] Filed: Sep. 30, 1992

Related U.S. Application Data

[63] Continuation of Ser. No. 596,721, Oct. 12, 1990, abandoned.

[30] Foreign Application Priority Data

Oct. 20, 1989 [FR] France .................. 89 13747

[51] Int. Cl.$^5$ .................................. H01L 41/08
[52] U.S. Cl. ................... 310/313 B; 310/313 D; 333/154
[58] Field of Search ........... 310/313 R, 313 B, 313 D; 333/194–196, 151, 153, 154

[56] References Cited

U.S. PATENT DOCUMENTS

| 3,792,381 | 2/1979 | Bristol | 310/313 B |
| 3,870,975 | 3/1975 | Vasile | 310/313 B X |
| 3,970,970 | 7/1976 | Worley | 310/313 D X |
| 3,987,376 | 10/1976 | Kerbel | 310/313 B X |
| 4,087,714 | 5/1978 | La Rosa | 310/313 B |
| 4,384,228 | 5/1983 | Dias | 310/313 D |
| 5,010,269 | 4/1991 | Hikita et al. | 310/313 B |
| 5,051,644 | 9/1991 | Wright | 310/313 B |
| 5,061,871 | 10/1991 | Wright | 310/313 B |

FOREIGN PATENT DOCUMENTS

| 0140618 | 5/1985 | European Pat. Off. |
| 0184508 | 6/1986 | European Pat. Off. |

OTHER PUBLICATIONS

Proceedings of the 40th Annual Frequency Control Symposium, 1986, pp. 269–274, T. N. Oliver, et al., "Low Loss, Highly Stable Saw Devices on Quartz".

*Primary Examiner*—Mark O. Budd
*Attorney, Agent, or Firm*—Oblon, Spivak, McClelland, Maier & Neustadt

[57] ABSTRACT

In a transducer for surface waves, an alternating succession of transmitter cells and reflector cells is used. The transmitter cells transmit surface waves in phase opposition, leftwards and rightwards. The reflector cells have a reflection coefficient that is in phase opposition between the left-hand side and the right-hand side. The waves transmitted by the transmitter cells interfere with the waves reflected by the reflector cells, destructively in one direction and constructively in the other direction. This enables the making of transducers with spacings equal to $\lambda/4$ and $\lambda/6$ only.

5 Claims, 3 Drawing Sheets

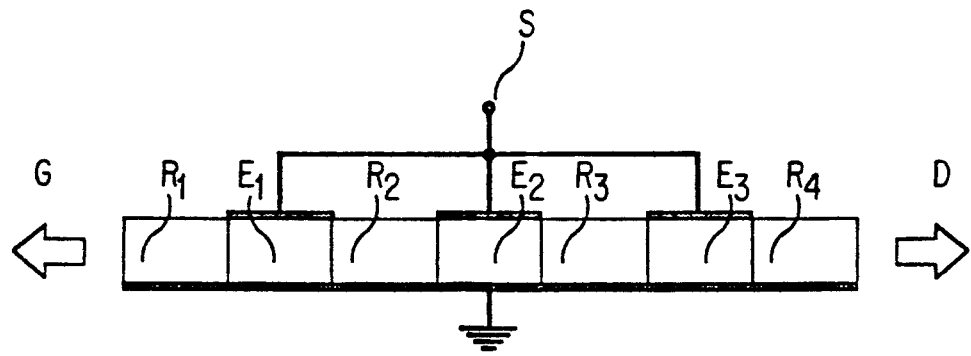
FIG_1
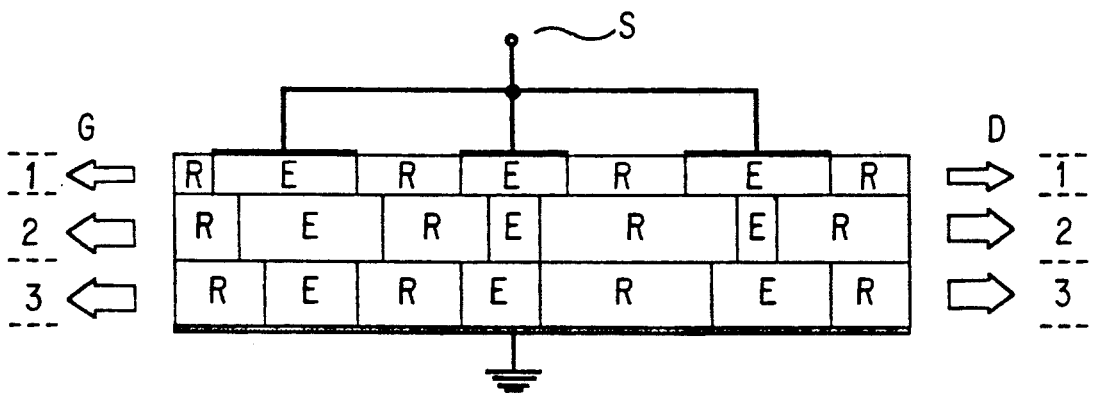
FIG_2
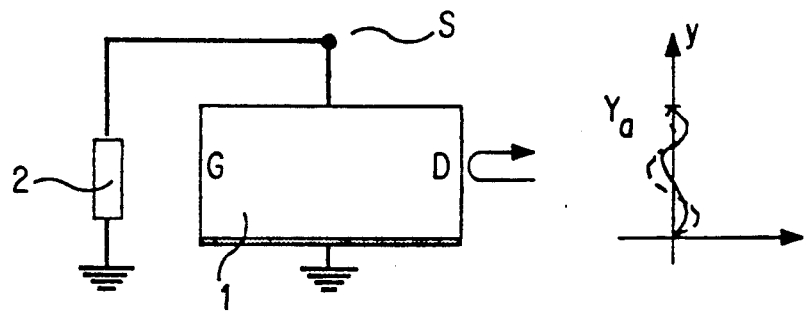
FIG_3

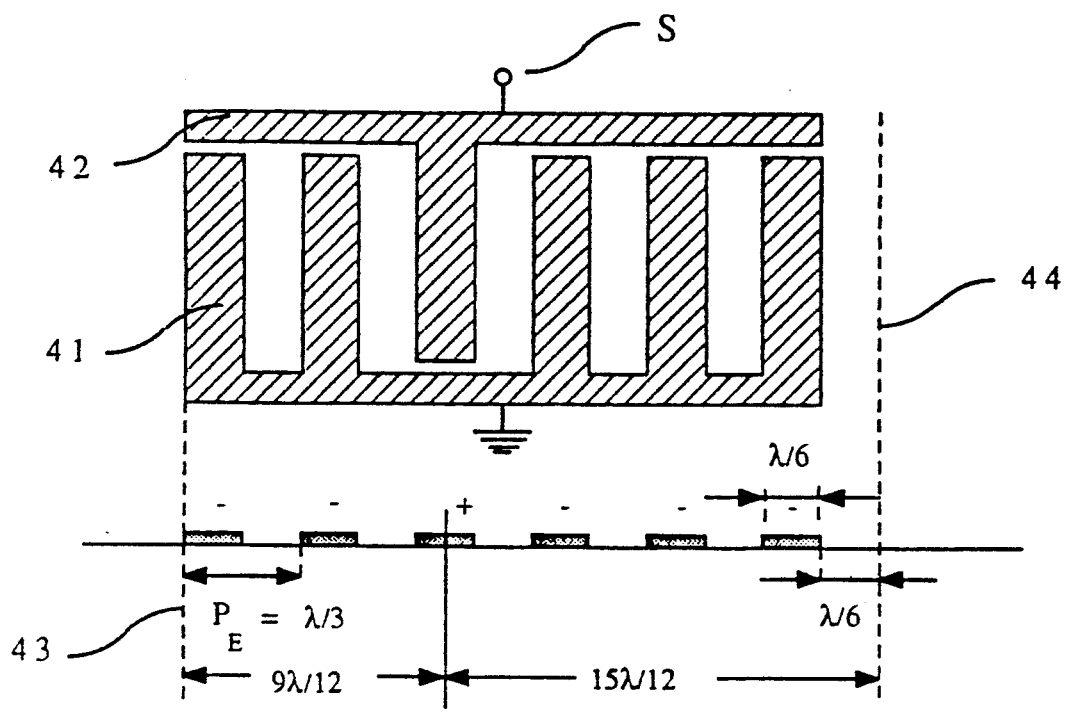
FIG_4
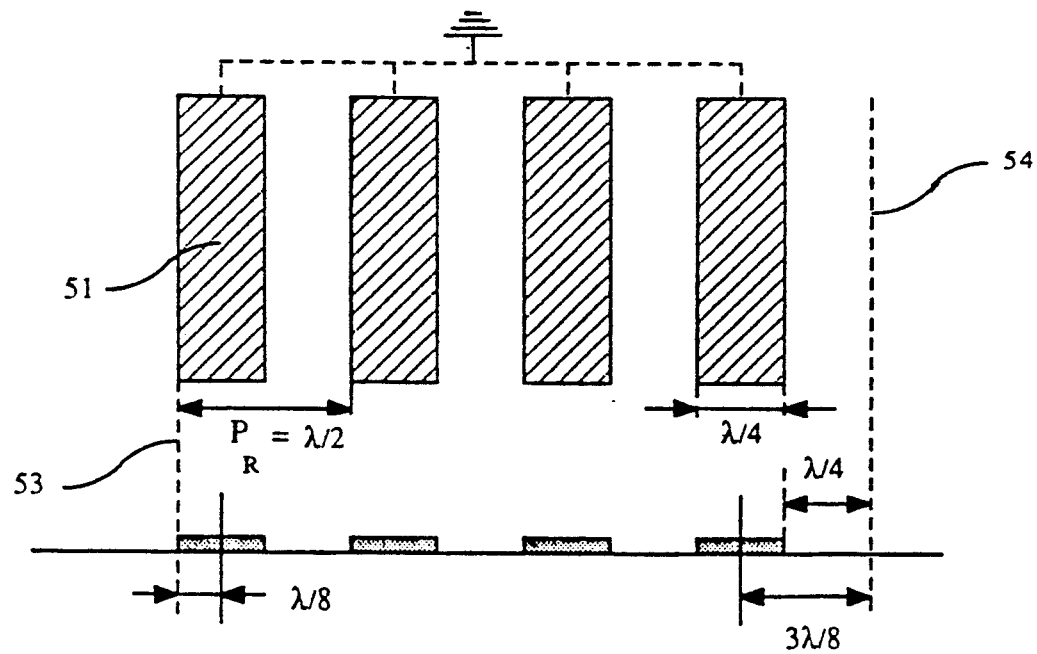
FIG_5

UNILATERAL SURFACE WAVE TRANSDUCER

This application is a continuation of application Ser. No. 07/596,721 filed on Oct. 12, 1990.

BACKGROUND OF THE INVENTION

1. Field of the Invention

The present invention pertains to unilateral surface wave transducers that enable the transmission of a surface wave on the surface of a substrate in such a way that the essential part of the signal emerges by one end of this transducer and that the signal, if any, emerging by the other end has a very low level as compared with the main signal.

2. Description of the Prior Art

A known way of making single-phase unilateral transducers is to use internal reflectors, the reflection phase center of which is shifted with respect to that of the electroacoustic sources. For this purpose, generally, either floating electrodes or metal or dielectric layers superimposed on the metallizations of the electrodes are used. In the case of floating electrodes, their pitch or spacing is $\lambda/8$, and the etching precision needed to obtain this pitch therefore restricts the frequencies accessible. In the case of superimposed layers, a method of manufacture at several levels must be used, and this seriously complicates matters and substantially increases costs.

SUMMARY OF THE INVENTION

To overcome these drawbacks, the invention proposes a unilateral surface wave transducer comprising an alignment, in alternating succession, of transmitter cells and reflector cells, separated by conventional left-hand and right-hand boundaries, wherein each transmitter cell is capable of transmission, by its left-hand and right-hand boundaries, of the waves in phase opposition, and each reflector cell has, at each of its left-hand and right-hand boundaries, coefficients of reflection in phase opposition.

BRIEF DESCRIPTION OF THE DRAWINGS

Other specific features and advantages of the invention shall appear clearly from the following description which is given as a non-restrictive example and is made with reference to the appended figures, of which:

FIG. 1 shows the drawing of a single-channel distributed acoustic transducer;

FIG. 2 shows the drawing of a multichannel distributed transducer;

FIG. 3 shows the drawing of a unilateral transducer;

FIG. 4 shows a transmission cell of a transducer according to the invention;

FIG. 5 shows a reflecting cell of a transducer; and

DETAILED DESCRIPTION OF THE INVENTION

Figure 6:
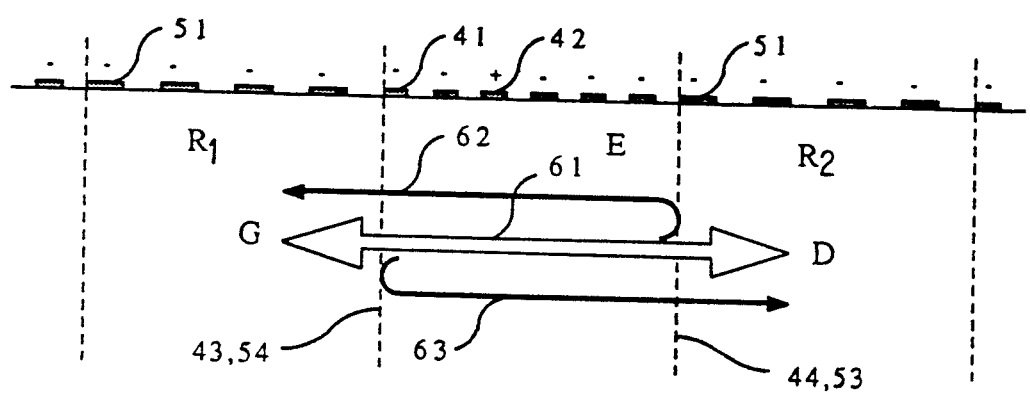
FIG. 6 shows a sectional view of a transducer according to the invention.

FIG. 1 shows the general structure of the electrodes of a transducer with distributed acoustic reflection, in such a way that they are placed on the surface of a piezoelectric substrate which is not shown in the figure. These electrodes are represented by rectangles within which there are positioned excitation means (not shown) generally taking the form of interdigitated combs. Of these combs, one is connected to the ground and the other is connected to an electrical connection S. When an electrical signal is applied at S, an acoustic wave is generated at each of the acoustic access points, namely the left-hand access (G) and the right-hand access (D) formed by the ends of the transducer. This assembly is, moreover, reversible and the acoustic waves that get propagated on the surface of the substrate can arrive by these access points to excite the transducer so that it delivers an electrical signal to the connection S.

The electrodes are grouped together in the form of transmitter cells $E_1$ to $E_3$ and reflecting cells $R_1$ to $R_4$, aligned alternately on the axis of propagation of the acoustic waves. Only the transmitter cells are connected to the electrical connection S and therefore excite acoustic waves on the surface of the substrate, while the reflecting cells modify the characteristics of acoustic propagation along this axis.

FIG. 2 shows the general structure of a transducer with several acoustic channels, 1 to 3 in this example, having characteristics that differ notably as a function of the frequency of the waves to be transmitted. For this purpose, three transducers similar to that of FIG. 1 are placed side by side. Each of these three transducers has a set of transmitter cells E and a set of receiver cells R. When the number of acoustic channels thus obtained is great, ultimately a weighted transducer is obtained.

FIG. 3 gives a very schematic view of a distributed acoustic reflection transducer 1, connected by means of an ouput electrode S and by the ground to a load 2. The total reflection coefficient F at on of the access points of this device is, for a given value of the load impedance 2, the sum of the reflection coefficient measured when S is directly connected to the ground, and of the acoustic re-transmission induced by the voltage at S. The amplitude and phase of this voltage depend on the load impedance 2. The reflection coefficient r(y) measured along the axis y of propagation of the acoustic waves is shown on the graph at the right-hand of the figure by the solid-line curve designating the real part of this coefficient and by the dashed curve designating its imaginary part.

F is then given by the formula:

$$F = \frac{1}{y_a} \int_0^{y_a} r(y)\, dy$$

It is thus possible to cancel F by a careful choice of the load impedance, thus making it possible to eliminate the triple transit echo for a filter or for a delay line.

Furthermore, the transducer can be designed so as to obtain zero electro-acoustical transfer between the input S and one of the acoustic access points. In such a case, a single-phase unilateral transducer is therefore obtained.

FIG. 4 shows two views of an transmitter cell E, a top view placed at the top of the figure and a sectional view placed at the bottom of the figure in correspondence. The two electrodes are in the form of interdigitated combs. The electrode 41 connected to the ground has five teeth, and the electrode 42 connected to the terminal S has only one tooth. These teeth are distributed with a pitch $P_E = \lambda/3$, taking for $\lambda$ the mean working wavelength of the device, and the succession of teeth is such at, going from the left-hand side towards the right-hand side, we have two teeth of the electrode 41, the tooth of the electrode 42 and the last three teeth of the electrode 41. If, therefore, by convention, we define a left-hand boundary located on the external edge of the first tooth to the left of the electrode 41, and a right-hand boundary located on the external edge of the electrode 41, at $\lambda/6$ from the external edge of last tooth of this same electrode, the center of the single tooth of the electrode 42 will be located at $9\lambda/12$ from the left-hand boundary and at $15\lambda/12$ from the right-hand boundary.

In view of the difference in the acoustic paths of the waves between the single tooth of the electrode 42, marked + in the figure by convention, and the left-hand and right-hand boundaries of the cell, as defined further above with respect to the end teeth of the electrode 41, marked − by convention, a difference in pace of $\lambda/2$ is obtained, this difference corresponding to a phase-shift of 180 degrees, between the waves being progagated leftwards and those being propagated rightwards, when they reach the left-hand and right-hand boundaries of the cell E.

The cell shown in FIG. 4 is a very particular and non-restrictive example of a transmitter cell and, particularly in order to increase the efficiency of transmission of the waves, it can be enlarged by being reproduced identically through simple translation by six elementary pitch steps $P_E$. The cells thus obtained will therefore have N teeth for the electrode 42 and 5N teeth for the electrode 41, and these teeth will succeed one another according to the sequence defined in FIG. 4.

FIG. 5 uses the same conventions as those of FIG. 4 to show a reflecting cell comprising a set of linear electrodes 51. These electrodes are spaced out with a pitch $P_R = \lambda/2$, and they can be either insulated or connected to one another and to the ground, i.e. in short-circuit. As in the case of the transmitter cell, a left-hand boundary 53 is defined, located on the external edge of the first electrode to the left, and a right-hand boundary 54 is defined, located at $\lambda/4$ from the external edge of the last electrode to the right. Each electrode behaves like an elementary reflector, and it is known that the reflection coefficient of each of these reflectors is purely imaginary if the axis of symmetry of this reflector is taken as a phase reference for the incident and reflected waves. This amounts to saying that the reflection takes place with a change in phase of + or −90 degrees. The determining of the choice between + or − depends on the physical properties of the materials and of the substrate in relation with the fact that the teeth ar either insulated or connected in short-circuit. In the most general case, we have the sign + when the teeth are in short-circuit and the sign − when the teeth are insulated. In the rest of the description, we shall consider the sign +, but the invention is also valid when we have the sign −.

Under these conditions, taking the left-hand boundary 53 as the reference starting point, the phase difference at this left-hand boundary between the incident wave and the wave reflected on the first reflector 51 is equal to 180 degrees, or $\lambda/2$, since there is a change in phase of 90 degrees due to the reflection and a change of 90 degrees due to the to-and-fro path on a length equal to $\lambda/4$ between the left-hand boundary and the center of the reflector. Since the distance between the reflectors is equal to $\lambda/2$, the to-and-fro path for the waves reflected on the other reflectors will always be equal to $M\lambda/2$, and the waves reflected will thus be in phase, and they too will be phase-shifted by 180 degrees on the left-hand boundary with respect to the incident wave.

When the acoustic waves come by the right-hand side, they too get reflected on the reflectors and, taking the right-hand boundary as the starting point of the phases, the length of the to-and-fro path is equal to $3\lambda/4$. Taking account of the change in phase of $\lambda/4$ due to the reception, this gives $\lambda$, that is 360 degrees. Thus the phase of the reflection coefficient at the right-hand boundary is zero, give or take a multiple of 360 degrees.

FIG. 6 shows a sectional view of a transmitter cell E identical to that of FIG. 4, surrounded by two reflecting cells $R_1$ and $R_2$ identical to that of FIG. 5. The respective distances between these cells are such that the right-hand boundary of the cell $R_1$ coincides with the left-hand boundary of the transmitting cell along a boundary 43, 54, and that the right-hand boundary of the transmitter cell coincides with the left-hand boundary of the reflector cell $R_2$ along a boundary 44, 53. The transducer cell E therefore transmits a wave represented by the line 61 in FIG. 6. This wave is transmitted leftwards as well as rightwards, and it has a phase difference of 180 degrees at the boundaries 43, 54 and 44, 53, as was shown further above.

The wave 61,D is reflected on the reflector $R_2$ to give a first reflected wave which is directed leftwards and is represented as 62 in the figure.

As shown further above, the reflection on the left-hand boundary 44, 53 of the reflector cell $R_2$ leads to a change in phase of 180 degrees. For this first reflected wave, the crossing of the transmitter cell E results in a phase rotation equal to twice 360 degrees in the case of the figure where, with six teeth, the path is equal to $2\lambda$. In the case of a transmitter cell that is N times greater, the change in phase will be equal to $2N \times 360$ degrees. In all, there is therefore conservation of phase.

Under these conditions, the reflected wave 62 is therefore in phase on the boundary 43, 54, with respect to the transmitted wave 61,G, and these two waves interfere with each other constructively, i.e. they get added up together.

The wave 61,G transmitted leftwards gets reflected on the right-hand boundary 43, 54 of the reflector cell $R_1$ to give a second reflected wave represented by a line 63 in the figure.

By applying the same line of reasoning as earlier, it is observed that, this time, at the boundary 44, 53, the reflected wave 63 has a phase difference of 180 degrees with respect to the direct wave 61,D since, as explained earlier, the reflection at the boundary 43, 54 takes place without change in phase. The wave 63 and the wave 61,D interfere destructively, and this leads to a very major attenuation of the residual wave being propagated towards the right of the figure.

It is therefore seen that there is thus obtained a transducer transmitting essentially a wave towards the left-hand side of the figure.

The simple structure of FIG. 6, comprising a transmitter cell surrounded by two reflector cells, can be extended without difficulty to a very large number of transmitter and reflector cells juxtaposed as in FIG. 1. It is then not necessary for all these cells to be identical with one another, provided that the above-described phase conditions are met. It is thus that the number of elementary reflectors 51 may be different from one cell to another, and that the number of electrodes 42 and 41 of the transmitter cells may itself also be different from one cell to another as was seen further above.

It is noted that, if the reflection coefficient proper to each elementary reflector of the cells R is equal to −90 degrees, the working of the assembly is reversed and a left-to-right unilateral transducer is obtained.

The device thus described has the advantage wherein it can be manufactured by a method using only one etching level, whether it is by the deposition of a conductive or dielectric layer, or by the etching of grooves in the substrate. When the elementary reflectors 51 are conductive and short-circuited, a protection is obtained against electrostatic and pyroelectric effects.

Finally, the characteristic dimensions of the elements of the transducer are restricted to 2, $\lambda/4$ and $\lambda/6$, and it is therefore possible to obtain devices working at higher frequencies than devices using a $\lambda/8$ geometry.

As has been already stated, a transducer such as this is strictly (imperfections excepted) unilateral only for the frequency (in principle the center frequency) used as a basis for the computations.

In certain cases, the unilateral characteristics may be partly sacrificed for other parameters. This is particularly so in the synthesis of filters where the number of parameters to be made mutually compatible is very great.

In such a case, the number of intervals between the transmitter cell and reflector cell are modified to obtain the desired characteristics.

Figure 7:
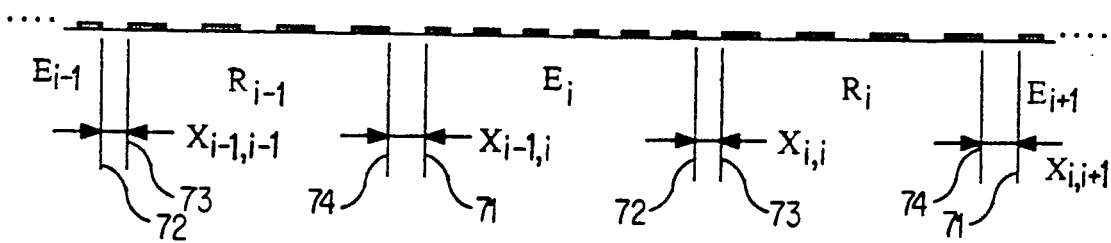
FIG. 7 shows a sectional view of a transducer according to the invention.

Thus in FIG. 7, depending on the conventions used in this description, the boundaries between the cell $E_i$ and the cells $R_{i-1}$ and $R_i$ are located at 71 and 73. Assigning references 74 and 72 to the edges of the fingers of $E_i$ and $R_{i-1}$, which face these boundaries 71 and 73, we obtain intervals $X_{i-1,i}$ and $X_{i,i}$ respectively between 74 and 71 and between 72 and 73.

When $X_{i-1,i}=\lambda/4$ and $X_{i,i}=\lambda/6$, we again find the unilateral transducer described further above, and FIG. 7 is identical to FIG. 6.

By contrast, when these distances are modified in a proportion that is smaller than $\lambda/6$, the transducer is no longer unilateral but its other characteristics get modified to be more adapted to other uses.

It will be seen that this amounts to starting, for the computations, from a value of $\lambda$ that does not correspond to the center frequency of the passband used.

The invention is not restricted to cells E that have only one electrical access. It extends to cells E having several access points, such as three-phase transducers.

Moreover, the number of teeth of a cell E is not restricted to a multiple of 3.

What is claimed is:

1. A unilateral surface wave transducer, comprising:
an alignment, in alternating succession, of transmitter cells and reflector cells, separated by conventional left-hand and right-hand boundaries;
wherein each transmitter cell is capable of transmission, by its left-hand and right-hand boundaries, of the waves in a phase opposition, and each reflector cell has, at each of its left-hand and right-hand boundaries, coefficients of reflection in phase opposition;
wherein the transmitter cells are formed by two electrodes in the form of interdigitated combs having a pitch equal to $\lambda/3$; $\lambda$ being the working center wavelength of the transducer; and
wherein the left-hand boundary of a transmitter cell is located along the external edge of the tooth furthest to the left of this cell and wherein the right-hand boundary is located at a distance equal to $\lambda/6$ from the external edge of the tooth furthest to the right of the cell, the width of the teeth being $\lambda/6$.

2. A unilateral surface wave transducer, comprising:
an alignment, in alternating succession, of transmitter cells and reflector cells, separated by conventional left-hand and right-hand boundaries, wherein each transmitter cell is capable of transmission, by its left-hand and right-hand boundaries of the waves in phase opposition, and each reflector cell has, at each of its left-hand and right-hand boundaries, coefficients of reflection in phase opposition; and
wherein each reflector cell includes a set of elementary reflectors arranged according to an elementary pitch equal to $\lambda/2$, the left-hand boundary of the cell being located along the external edge of the elementary reflector furthest to the left, and the right-hand boundary of the cell being located at a distance equal to $\lambda/4$ from the external edge of the reflector furthest to the right; each reflector having a width equal to $\lambda/4$.

3. A transducer according to claim 2, wherein the elementary reflectors are insulated electrodes.

4. A transducer according to claim 2, wherein the elementary reflectors are short-circuited electrodes.

5. A unilateral surface wave transducer comprising:
an alignment, in alternating succession, of transmitter cells and reflector cells, separated by conventional left-hand and right-hand boundaries, wherein each transmitter cell is capable of transmission, by its left-hand and right-hand boundaries, of the waves in phase opposition, and each reflector cell has, at each of its left-hand and right-hand boundaries, coefficients of reflection in phase opposition;
wherein the transmitter cells are formed by two electrodes in the form of interdigitated combs having a pitch equal to $\lambda/3$; $\lambda$ being the working center wavelength of the transducer; and
wherein the left-hand boundary of a transmitter cell is located at a distance smaller than $\lambda/6$ from the external edge of the tooth furthest to the left of this cell, and the right-hand boundary is located at a distance smaller than $\lambda/6$ from the external edge of the tooth furthest to the right of the cell; the width of the teeth being $\lambda/6$.

* * * * *